United States Patent
Johnson

(10) Patent No.: US 7,821,131 B2
(45) Date of Patent: Oct. 26, 2010

(54) SUBSTRATE INCLUDING BARRIER SOLDER BUMPS TO CONTROL UNDERFILL TRANSGRESSION AND MICROELECTRONIC PACKAGE INCLUDING SAME

(75) Inventor: Alan E. Johnson, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 11/766,262

(22) Filed: Jun. 21, 2007

(65) Prior Publication Data

US 2008/0315410 A1 Dec. 25, 2008

(51) Int. Cl.
*H01L 23/52* (2006.01)
(52) U.S. Cl. ............... 257/737; 257/778; 257/E21.508
(58) Field of Classification Search ................ 257/738, 257/737, 778, 666
See application file for complete search history.

(56) References Cited

U.S. PATENT DOCUMENTS

| | | |
|---|---|---|
| 6,614,122 B1 | 9/2003 | Dory |
| 2002/0121707 A1* | 9/2002 | Pendse et al. ............... 257/778 |
| 2002/0167075 A1* | 11/2002 | Madrid ....................... 257/666 |

FOREIGN PATENT DOCUMENTS

| | | | |
|---|---|---|---|
| JP | 01290292 A | * | 11/1989 |
| JP | 10189819 A | * | 7/1998 |

* cited by examiner

*Primary Examiner*—Jerome Jackson, Jr.
*Assistant Examiner*—Dale Page
(74) *Attorney, Agent, or Firm*—Blakely, Sokoloff, Taylor & Zafman LLP

(57) ABSTRACT

A microelectronic substrate and a microelectronic package including the substrate and a die bonded thereto. The substrate includes a substrate panel having a die-side surface including a die-attach region; a system of interconnects extending through the substrate panel and adapted to allow a connection of the substrate to external circuitry; and a plurality of solder bumps including: die-attach solder bumps electrically coupled to the system of interconnects and disposed in the die-attach region; and barrier solder bumps isolated from the system of interconnects, the barrier solder bumps being disposed outside of the die-attach region and being adapted to substantially limit a flow of underfill away from the die-attach region.

14 Claims, 4 Drawing Sheets

SUBSTRATE INCLUDING BARRIER SOLDER BUMPS TO CONTROL UNDERFILL TRANSGRESSION AND MICROELECTRONIC PACKAGE INCLUDING SAME

FIELD

Embodiments of the present invention relate generally to the field of microelectronic fabrication, and, in particular to a method of providing solder joints between a substrate and an integrated circuit (IC) die.

BACKGROUND

As seen in FIG. 1, during a conventional flip-hip attach process, a microelectronic die 10 including die pads 12 thereon, such as copper bumps, for example, is brought into registration with solder bumps 14 on a package substrate 16 having corresponding land pads (or surface finish layers) 18 supporting the solder bumps, and a solder resist layer 19 supported on a substrate panel 15. A system 11 of interconnects extends through the substrate panel of the substrate and is adapted to allow a connection of the substrate to external circuitry in a well known manner, such as to a printed circuit board (PCB) by way of PCB-side lands of the substrate (not shown). After alignment of respective die pads 12 to corresponding solder bumps 14 of the substrate, the prior art subjects the die-substrate combination to a bonding process including a reflow of the solder bumps. After reflow, the solidified solder forms solder joints 20 (FIGS. 2-5) between the die 10 and substrate 16. Thereafter, an underfill material 23 in liquid form comprising epoxy for example, may be dispensed to flow between the solder joints 20 and a die-attach region 24 of the substrate. The underfill material is typically provided to prevent the solder joints 20 from moving as a result of thermal cycling and electrical shorts during the life of the package. In addition, the underfill material acts as a thermal conductor, mediating the thermal mismatch between die and substrate. A capillary action of the solder joints 20 draws the underfill material into the space between the die and the substrate at the die-attach region. It is not unusual for the liquid underfill material 23 to transgress beyond the die-attach region of the substrate, and in some instances far enough to cover adjacent substrate lands 28, such as those used to attach additional components, such as passive electrical components including capacitors, as shown in FIG. 2.

After the underfill material 23 fills the die-attach region 24, it may be cured to yield a microelectronic package such as packages 25, 35, 45, 55 and 65 of FIGS. 2, 3, 4, 5 and 6, respectively. A typical prior art flip chip package such as package 25/35/45/55/65 includes the substrate 16, the die 10 bonded to the substrate by a bond 26, where the bond includes the solder joints 20 and the underfill material 23 in cured form.

The prior art has attempted to address the problem of underfill transgression beyond the die-attach region and possibly onto the substrate lands such as lands 28 (as shown in FIG. 2) by either: (1) requiring the design of a "keep-out" zone 33 for die-side electrical component placement onto the substrate as shown in FIG. 3; (2) providing a reduced amount of underfill 23 as shown in FIG. 4; and/or (3) providing at least one of trenches 57 and/or barriers 67 in the path of the underfill material 23 flowing out from between the die and the substrate, as seen in FIGS. 5 and 6, respectively. The solution of FIG. 3, however, disadvantageously limits the possibility of reducing package size. The solution of FIG. 4 on the other hand poses reliability issues with respect to the die-substrate bond, as not enough underfill may be provided to bring forth the required benefits of underfill use in the first instance. The solutions of FIGS. 5 and 6 disadvantageously require the provision of additional tools and process flow stages than those in the existing process flow of making the package substrate, raising manufacturing costs and reducing throughput per unit time. In addition, for the barriers 67 shown in FIG. 6, a distance between the barriers and the edge of the die would depend on the actual nature of the barrier material and on how it would be provided. It would be difficult, in general, to put the barrier material within 100-200 microns of the die edge. If the barriers 67 are placed prior to die attach, then physical or chemical interactions between the barrier material and the die attach solder bumps on the substrate would need to be considered during the application of the barrier material and the application of the substrate solder bumps as well as during the chip attach process. As an example, physical masking would be required to physically and chemically protect the bump field during the subsequent application of the barrier material. This physical mask requires a physical space to account for the size of the mask as well as a consideration of possible registration errors of the mask relative to the bump field. As a second example, the barrier material must also be chemically compatible with the chip attach flux and not be degraded during solder reflow. If the barriers 67 placed following chip attach, on the other hand, mechanical interference between the die and the barrier material mask would need to be considered, adding to design complications.

None of the prior art solutions described above and shown in the figures, however, are adequate in providing an effective, reliable and cost-conscious solution to the problem of underfill transgression as described above.

Figure 1:
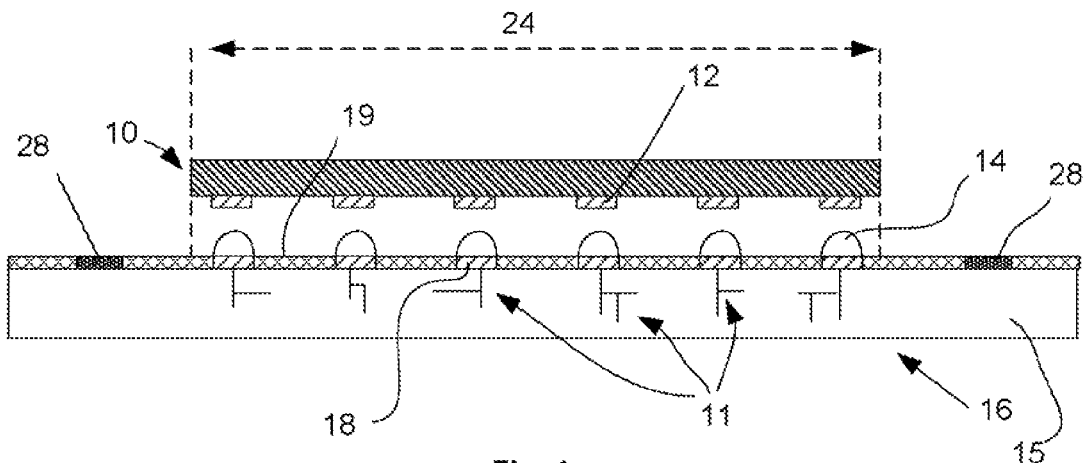
FIG. 1 is a side cross sectional view of a die-substrate combination prior to flip chip attach according to the prior art.
Figure 2:
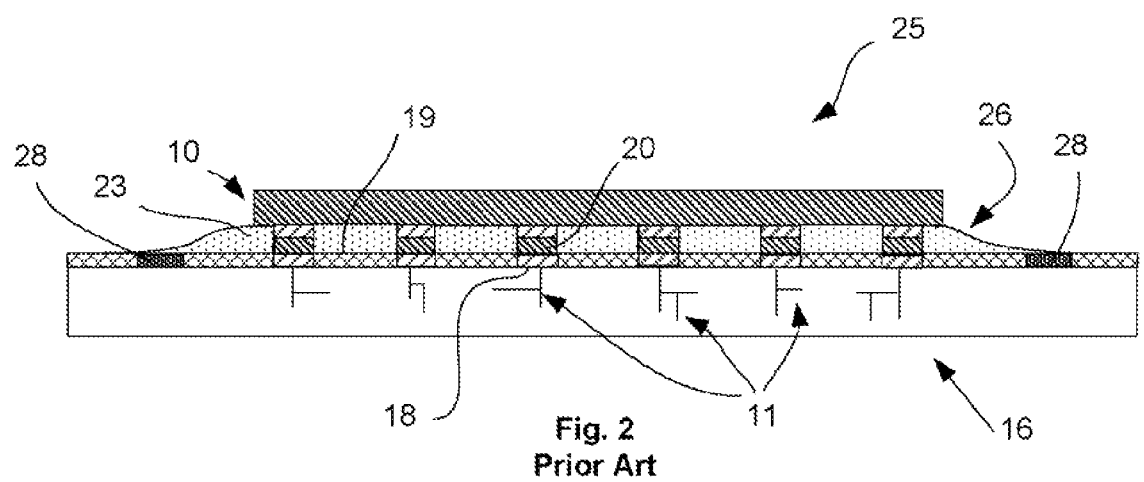
FIG. 2 is a side cross sectional view of a microelectronic package formed from a flip chip bonding of the combination of FIG. 1.
Figure 3:
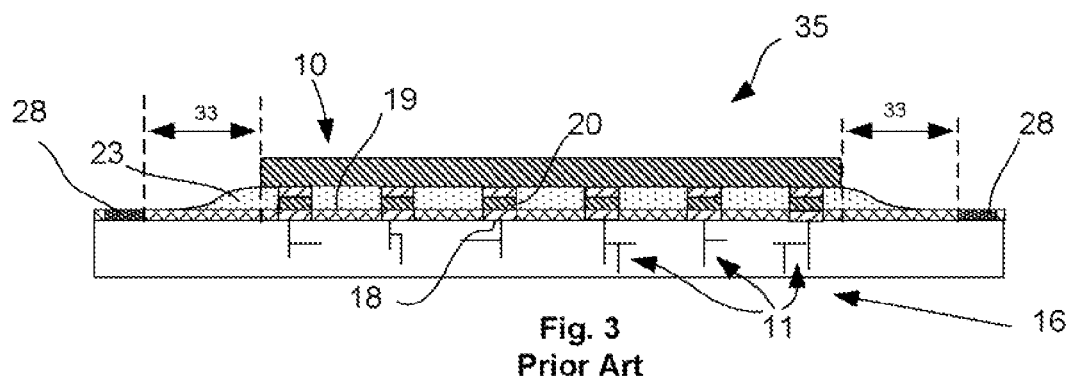
FIGS. 3-6 are side cross sectional views showing microelectronic package similar to FIG. 2, but also including underfill transgression control features according to the prior art.
Figure 4:
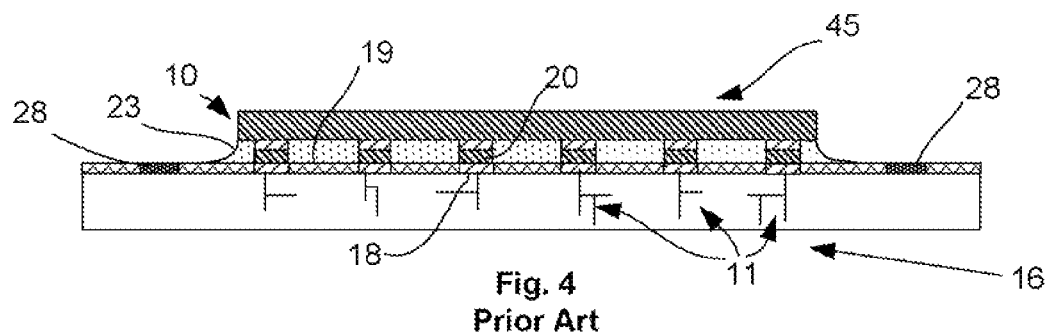
Figure 5:
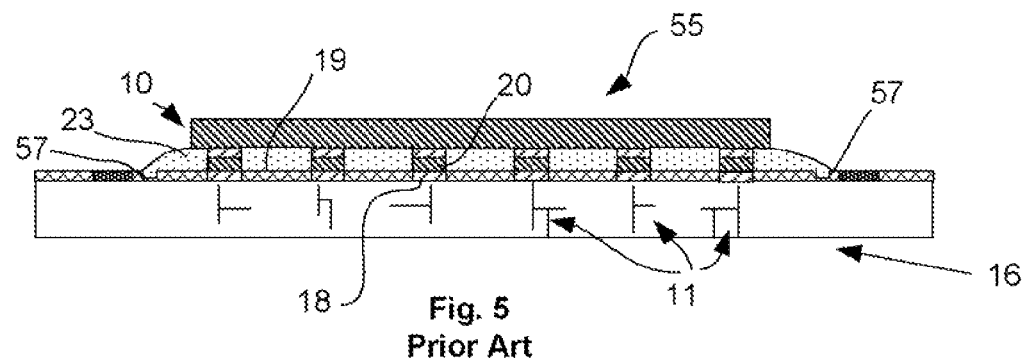
Figure 6:
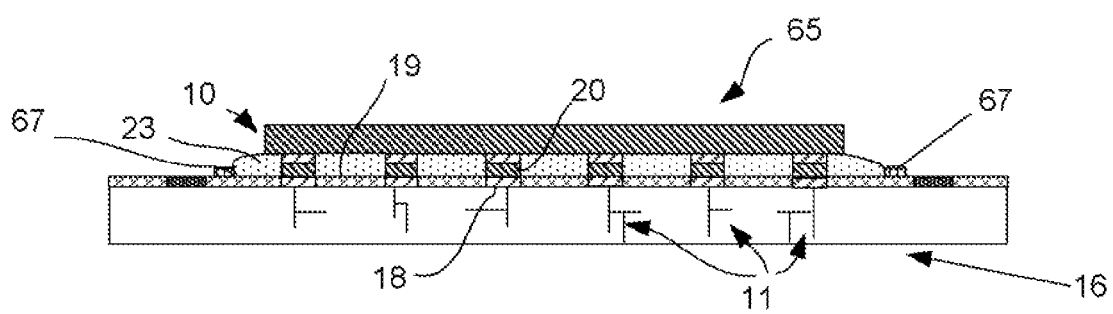

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic substrate including barrier solder bumps and a package including the substrate are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 7-12 below, where like references denote like elements. The figures, however, should not be taken to be limiting, as are intended for the purpose of explanation and understanding.

Figure 7:
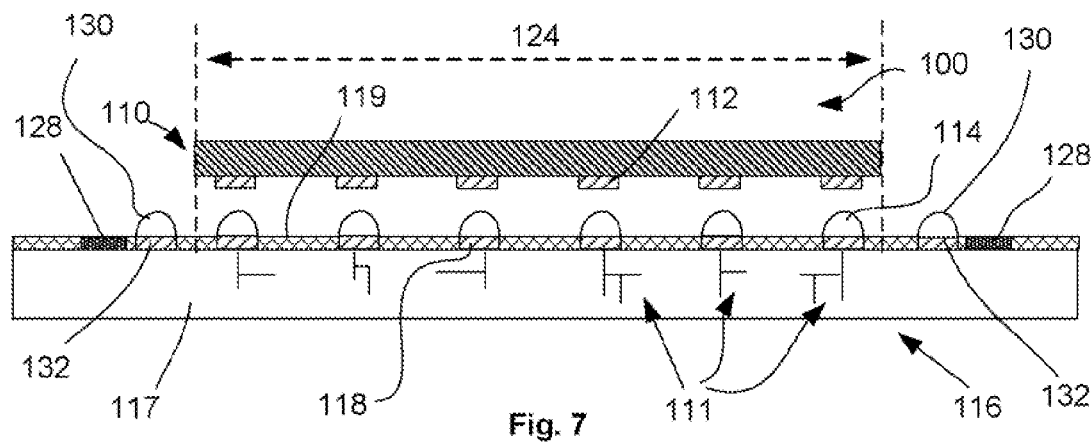
FIG. 7 is a side cross sectional view of a die-substrate combination prior to flip chip attach according to one embodiment.
Figure 8:
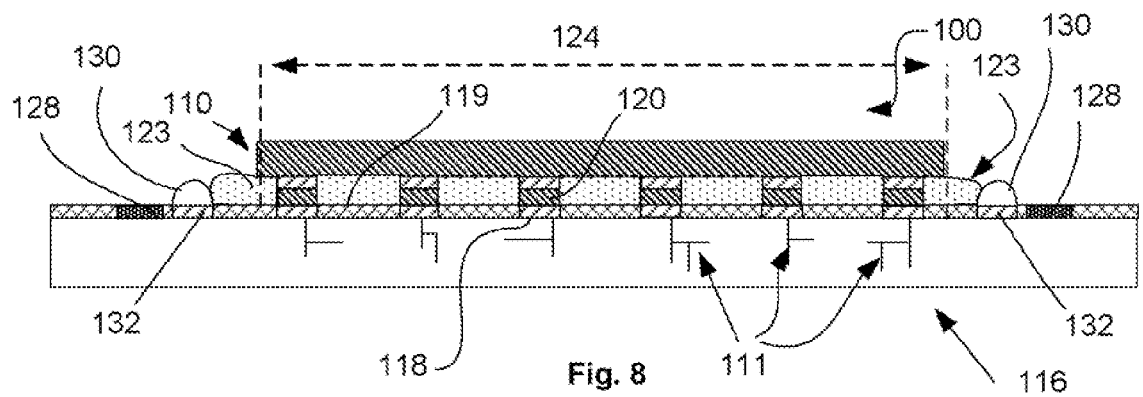
FIG. 8 is a side cross sectional view of a microelectronic package formed from the combination of FIG. 7.
Figures 9, 10, 11:
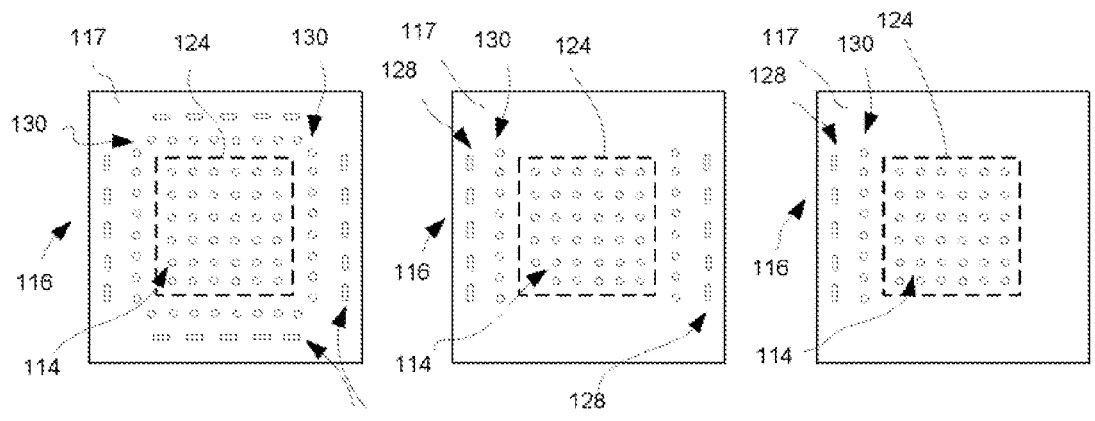
FIGS. 9-11 show top plan views of three different substrate embodiments.

As seen in FIG. 7, according to embodiments, a microelectronic substrate 116 includes a substrate panel 117 which has a die-side surface defining a die-attach region 124. By "die-attach region" of the substrate, what is meant in the context of embodiments is a region on the die-side of the substrate corresponding to the footprint of a die adapted to be aligned and mounted onto the substrate. Optionally, a solder resist layer 119 may be provided as part of the substrate in a well known manner. Substrate 116 according to embodiments further includes a system 111 of interconnects extending through substrate panel 117, and adapted to allow a connection of the substrate to external circuitry, such as to a PCB by way of PCB-side lands of the substrate (not shown). A plurality of solder bumps are further shown on the substrate panel 117 as part of the substrate. The solder bumps include die-attach solder bumps 114 electrically coupled to the system 111 of interconnects and disposed in the die-attach region 124. According to embodiments, the solder bumps further includes barrier solder bumps 130 that are isolated from the system 111 of interconnects, and disposed outside of the die-attach region 124. The barrier solder bumps 130 are positioned and configured to substantially limit a flow of underfill material (such as, for example, epoxy) away from the die-attach region 124 during a flip chip bonding of die 110 to substrate 116. The barrier solder bumps may be disposed adjacent a periphery of the die-attach region 124, or anywhere between that periphery and a region of the substrate to be protected from underfill transgression (hereinafter "the substrate region to be protected"), such as, as shown in FIGS. 7 and 8, the region corresponding to land pads 128. By "periphery," what is meant is the immediate edge or border of the die-attach region 124 (as shown for example in broken lines in FIGS. 9-11). A placement and a configuration of the barrier solder bumps may be chosen as a function of a number of factors, such as, for example, as a function of the substrate region to be protected, of the type and amount of underfill material, of the volume of underfill to be provided on the die-attach region 124 of the substrate, as would be recognized by one skilled in the art. According to one embodiment, the barrier solder bumps 130 may define a pattern corresponding to a pattern of a periphery of the die-attach region (that is, may define, for example, a rectangle or a square is the die-attach region defines, respectively, a rectangle or a square), as shown schematically by way of example in the embodiment of the substrate 116 of FIG. 9. Additionally, as also shown in FIG. 9, and also in the embodiments of the substrate 116 shown in FIGS. 10 and 11, the barrier solder bumps 130 may exhibit substantially the same pitch, and substantially the same diameter as the die-attach solder bumps 114. Embodiments, however, are not limited to the provision of barrier solder bumps 130 on all sides of the die-attach region. According to one embodiment, the barrier solder bumps 130 may be provided on only two opposite sides of the die-attach region 124 as shown in the substrate 116 embodiment of FIG. 10, or on one side of the die-attach region as shown in substrate 116 embodiment of FIG. 11. According to embodiments, the barrier solder bumps 130 may be provided anywhere on the substrate panel 117 where a barrier would be needed to underfill transgression. Thus, embodiments would encompass one or more barrier solder bumps on one or more sides of the die-attach region of a substrate, including barrier solder bumps providing underfill transgression protection along only a partial length of a side of the die-attach region.

According to one embodiment, as shown in FIG. 7, the solder bumps 114/130 may be disposed on respective metal pads on the substrate panel. The metal pads may include, as shown by way of example in FIG. 7, land pads 118 electrically coupled to the system 111 of interconnects, the land pads 118 being disposed in the die-attach region 124 of the substrate panel 117. The metal pads may further include, as also shown by way of example in FIG. 7, barrier pads 132 isolated from the system 111 of interconnects, the barrier pads 132 being disposed outside of the die-attach region 124. In such a case, the die-attach solder bumps 114 may be disposed on respective ones of the land pads 118, and the barrier solder bumps may be disposed on respective ones of the barrier pads 132 as shown. Metal pads such as land pads 118 and barrier pads 132 may include any conventional surface finish adapted to be disposed on a substrate panel, as would be recognized by one skilled in the art, and may be provided for example to allow the adhesion of certain solder compositions onto the substrate panel with ease. To the extent that the barrier solder bumps would not provide electrical interconnection between various elements of the package/substrate, they are isolated from the system 111 of interconnects within the substrate panel 117.

Referring still to FIG. 7, a microelectronic die 110 is further shown including die pads 112 thereon, die pads 112 including conventional metallization layers such as, for example, layers including copper, gold and the like. In FIG. 7, the die 110 is shown as having been aligned with the substrate for flip chip mounting therewith. Alignment of the die 110 with the substrate 116 entails, as shown, a registration of die pads 112 with the die-attach solder bumps 114 of the substrate 116 and an alignment of the die 110 with the die-attach region 124 of the substrate 116 as shown. After alignment as shown in FIG. 7, the die 110 and substrate 116 may be subjected to a flip chip bonding process including a reflow of the solder bumps in a conventional manner.

As a result of reflow, as shown in FIG. 8, solder joints 120 may be formed from die attach solder bumps 114 between the die 110 and substrate 116, mechanically and electrically bonding the die to the substrate to form a microelectronic package 100. A reflow to affect flip chip bonding of die 110 to substrate 116 may melt the barrier solder bumps 130 during the elevated reflow temperatures. However, after a cool down stage of the reflow process, the barrier solder bumps 130 substantially re-assume their initial configurations as shown in FIG. 7. FIG. 8 also shows underfill material 123 as having been introduced into the die-attach region 124, its flow having been bounded by barrier solder bumps 130, thus leaving the substrate regions to be protected, in this case, the region of lands 128, protected from underfill transgression. When liquid underfill is dispensed into the die-attach region 124 after solder joint 120 formation, although the liquid underfill may flow outside the boundaries of region 124, such transgression may be halted by the barrier solder bumps 130. Then, curing of the underfill material 123 would set the same into place, in this way leaving the lands 128 protected. Although the package of FIG. 8 shows the underfill 123 as having been stopped at one side of the barrier solder bumps 130, embodiments are not so limited, and include within their scope a package where the underfill may have covered the barrier solder bumps, but been limited in its path by the same. In general, what is meant by "transgression" herein is transgression into areas of the substrate to be protected from the underfill, such as lands 128.

Advantageously, embodiments provide a reliable and cost-effective package substrate structure for limiting underfill transgression during flip chip bonding of a die to a substrate by providing barrier solder bumps onto the substrate. Embodiments do not require the provision of additional tooling or processes for providing the barrier solder bumps, and can advantageously use existing tooling and processes, the same as used to provide the die attach solder bumps onto the substrate panel, in order to provide the barrier solder bumps. Additionally, embodiments ensure adequate wetting of the underfill on the die sidewalls by not limiting the amount of underfill to be dispensed. Moreover, advantageously, embodiments allow the provision of barrier solder bumps close to the periphery of the die-attach region of the substrate, in this way allowing tight underfill flow control and therefore smaller packages. The barrier solder bumps provide surfaces on the package substrate that create surface tension in the path of underfill flow, in this manner curbing underfill transgression.

Figure 12:
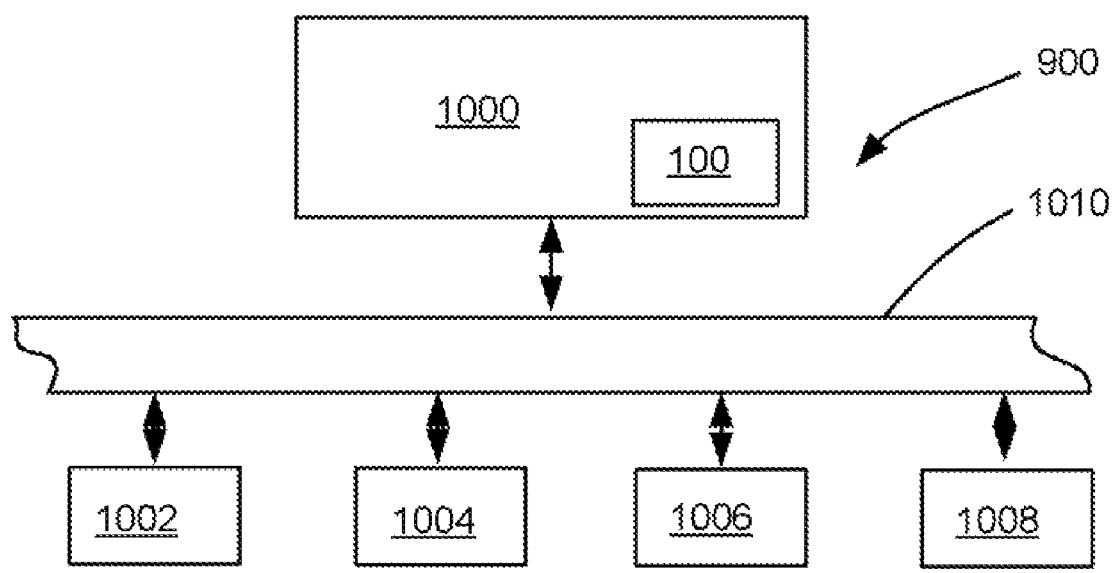
FIG. 12 is a schematic view of an embodiment of a system incorporating a microelectronic package as shown in FIG. 8.

Referring to FIG. 12, there is illustrated one of many possible systems 900 in which embodiments of the present invention may be used. In one embodiment, the electronic assembly 1000 may include a microelectronic package, such as package 100 of FIG. 8. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 12, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic substrate including:
    a substrate having a die-side surface including a die-attach region;
    a system of interconnects extending through the substrate and adapted to allow a connection of the substrate to external circuitry;
    a plurality of solder bumps including:
        a plurality of die-attach solder bumps electrically coupled to the system of interconnects and disposed in the die-attach region; and
        a plurality of barrier solder bumps isolated from the system of interconnects, the barrier solder bumps being disposed outside of the die-attach region and being adapted to substantially limit a flow of underfill away from the die-attach region; and
    a plurality of metal pads on the substrate, wherein the plurality of metal pads include barrier pads isolated from the system of interconnects, the barrier pads being disposed outside of the die-attach region, and the barrier solder bumps being disposed on respective ones of the barrier pads.

2. The substrate of claim 1, wherein the plurality of metal pads further include die-attach pads electrically coupled to the system of interconnects, at least some of the die-attach pads being disposed in the die-attach region of the substrate, the die-attach solder bumps being disposed on respective ones of the at least some of the die-attach pads.

3. The substrate of claim 1, wherein the barrier solder bumps are disposed adjacent a periphery of the die-attach region.

4. The substrate of claim 1, wherein the barrier solder bumps define a pattern corresponding to a pattern of a periphery of the die-attach region.

5. The substrate of claim 1, wherein the barrier solder bumps exhibit the same pitch as the die-attach solder bumps.

6. The substrate of claim 1, wherein the barrier solder bumps exhibit the same diameter as the die-attach solder bumps.

7. The substrate of claim 1, wherein the barrier solder bumps are disposed on at least one side of the die-attach region.

8. A microelectronic package including:
    a microelectronic die;
    a package substrate, the die being flip-chip mounted to the substrate, the substrate including:
        a substrate having a die-side surface including a die-attach region;
        a system of interconnects extending through the substrate and adapted to allow a connection of the substrate to external circuitry;
        die-attach solder joints electrically coupled to the system of interconnect, disposed in the die-attach region and bonding the die to the substrate;
        a plurality of barrier solder bumps isolated from the system of interconnects, the barrier solder bumps being disposed outside of the die-attach region; and
        a plurality of metal pads on the substrate, wherein the plurality of metal pads include barrier pads isolated from the system of interconnects, the barrier pads being disposed outside of the die-attach region, and the barrier solder bumps being disposed on respective ones of the barrier pads; and an underfill material disposed between the die and the substrate, the underfill material contacting the barrier solder bumps.

9. The package of claim 8, wherein the plurality of metal pads further include die-attach pads electrically coupled to the system of interconnects, at least some of the die-attach pads being disposed in the die-attach region of the substrate, the solder joints being disposed on respective ones of the at least some of the die-attach pads.

10. The package of claim 8, wherein the barrier solder bumps are disposed adjacent a periphery of the die-attach region.

11. The package of claim 8, wherein the barrier solder bumps define a pattern corresponding to a pattern of a periphery of the die-attach region.

12. The package of claim 8, wherein the barrier solder bumps exhibit substantially the same pitch as the die-attach solder bumps.

13. The package of claim 8, wherein the barrier solder bumps exhibit substantially the same diameter as the die-attach solder bumps.

14. The package of claim 8, wherein the barrier solder bumps are disposed on at least one side of the die-attach region.

* * * * *